(12) United States Patent
Liu

(10) Patent No.: US 8,242,936 B2
(45) Date of Patent: Aug. 14, 2012

(54) CONTROL PANEL AND CONTROL METHOD THEREOF

(75) Inventor: Chang-Li Liu, Taoyuan (TW)

(73) Assignee: Ichia Technologies, Inc., Hwa-Ya Tech. Park, Gueishan, Taoyuan (TW)

(*) Notice: Subject to any disclaimer, the term of this patent is extended or adjusted under 35 U.S.C. 154(b) by 471 days.

(21) Appl. No.: 12/687,131

(22) Filed: Jan. 14, 2010

(65) Prior Publication Data

US 2011/0122000 A1 May 26, 2011

(30) Foreign Application Priority Data

Nov. 26, 2009 (TW) ............................. 98140313 A

(51) Int. Cl.
*H03K 17/94* (2006.01)

(52) U.S. Cl. ............ 341/20; 362/231; 345/419; 349/58; 463/31; 463/16

(58) Field of Classification Search ............... 341/20; 362/231; 345/419; 349/58; 463/16, 31
See application file for complete search history.

(56) References Cited

U.S. PATENT DOCUMENTS

| 7,338,366 | B2* | 3/2008 | Rosander et al. | 463/16 |
| 2004/0121840 | A1* | 6/2004 | Rosander et al. | 463/31 |
| 2012/0099304 | A1* | 4/2012 | Kim et al. | 362/231 |

* cited by examiner

*Primary Examiner* — Lam T Mai
(74) *Attorney, Agent, or Firm* — Winston Hsu; Scott Margo

(57) ABSTRACT

A control method of a control panel is disclosed. First, a first display plate having at least one first pattern is provided, and the first display plate is in an on-state, so that the first pattern is shown. Then, a touch region of a touch panel disposed on the first display plate is touched, and a second display plate having at least one second pattern and disposed under the first display plate is turned on, so that the second pattern is displayed. Accordingly, changes of different patterns respectively in different layers can be displayed.

20 Claims, 15 Drawing Sheets

CONTROL PANEL AND CONTROL METHOD THEREOF

BACKGROUND OF THE INVENTION

1. Field of the Invention

The present invention relates to a control panel and a control method thereof, and more particularly, to a control panel having a plurality of patterns in different layers and a control method thereof.

2. Description of the Prior Art

With the rapid development of technology, consumers increasingly rely on using various portable electronic devices, such as mobile phone or personal digital assistant (PDA). In order to be operated easily by the consumers, the electronic device usually includes a built-in control panel, such as keypad. Recently, in order to have extension of function and small size together, touch panels has been increasingly applied to the electronic devices, so that the electronic devices can be operated by a touching method. Therefore, requirements of the consumers can be fulfilled.

Please refer to FIG. 1, which is a schematic diagram illustrating a touch keypad according to the prior art. As shown in FIG. 1, the touch keypad 10 of the prior art includes a transparent substrate 12 and a touch panel 14 disposed on the transparent substrate 12. The transparent substrate 12 has a plurality of patterns 16 thereon, and the touch panel 14 has a plurality of touch regions 18. Each touch region 18 corresponds to each pattern 16. In addition, when a finger touches or presses one of the touch regions 18, a function corresponding to the touch region 18 is performed, so that a display device connected to the touch keypad 10 can be controlled.

Please refer to FIG. 2, which is a schematic diagram illustrating a touch display panel according to the prior art. As shown in FIG. 2, the touch display panel 30 of the prior art includes a liquid crystal display (LCD) panel 32 and a touch panel 34 disposed on the LCD panel 32. The LCD panel 32 has a plurality of pixel region 36, and the touch panel 34 has a plurality of touch region 38. Each touch region 38 corresponds to each pixel region 36. Accordingly, when a finger touches or presses one of touch regions 38, a function corresponding to the pixel region 36 can be performed. Therefore, the display of the LCD panel 32 can be controlled or a device connected to the touch display panel 30 of the prior art can be controlled.

However, the touch keypad and the touch display panel of the prior art can only display a vision with single-layer pattern, but cannot display a vision with stereoscopic pattern or with changes of patterns in different layers. Furthermore, the pattern can not be viewed from a back side of the touch display panel of the prior art. For this reason, the touch keypad and the touch display panel of the prior art are limited by themselves structure to have no vision with changes of various patterns in different layers. Therefore, to provide a control panel being able to generate changes of patterns in different layers to fulfill the visional requirement of the consumers is an objective of the industry.

SUMMARY OF THE INVENTION

It is therefore an objective of the present invention to provide a control panel and a control method thereof to display changes of different patterns in different layers.

According to the present invention, a control method of a control panel is provided. First, a first display plate having at least one first pattern is provided, and the first display plate is in an on-state and displays the first pattern. Then, a touch region of a touch panel disposed on the first display plate is touched to turn on a second display plate disposed under the first display plate and having at least one second pattern, so that the second pattern is displayed.

According to the present invention, a control panel is provided. The control panel includes a first display plate, a second display plate disposed under the first display plate, a touch panel disposed on the first display plate, an adhesive layer, a first flexible printed circuit (FPC) and a second FPC. The first display plate includes a first light guide plate and at least one first light source, and the first light source is disposed at an edge of the first light guide plate. The first light guide plate has at least one first pattern. The second display plate includes a second light guide plate and at least one second light source, and the second light source is disposed at an edge of the second light guide plate. The second light guide plate has at least one second pattern. The touch panel has at least one touch region, and the first pattern and the second pattern are disposed under the touch region. The adhesive layer is disposed between the first display plate and the second display plate, so that a gap exists between the first display plate and the second display plate. The first FPC is electrically connected to the first light source and the second light source, and the second FPC is electrically connected to the touch panel.

The control panel of the present invention provides a plurality of display plates, and the pattern of each display plate corresponds to a same touch region. The control panel can therefore display changes of different patterns in different layers, and an effect of changing patterns in the same touch region can be therefore provided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
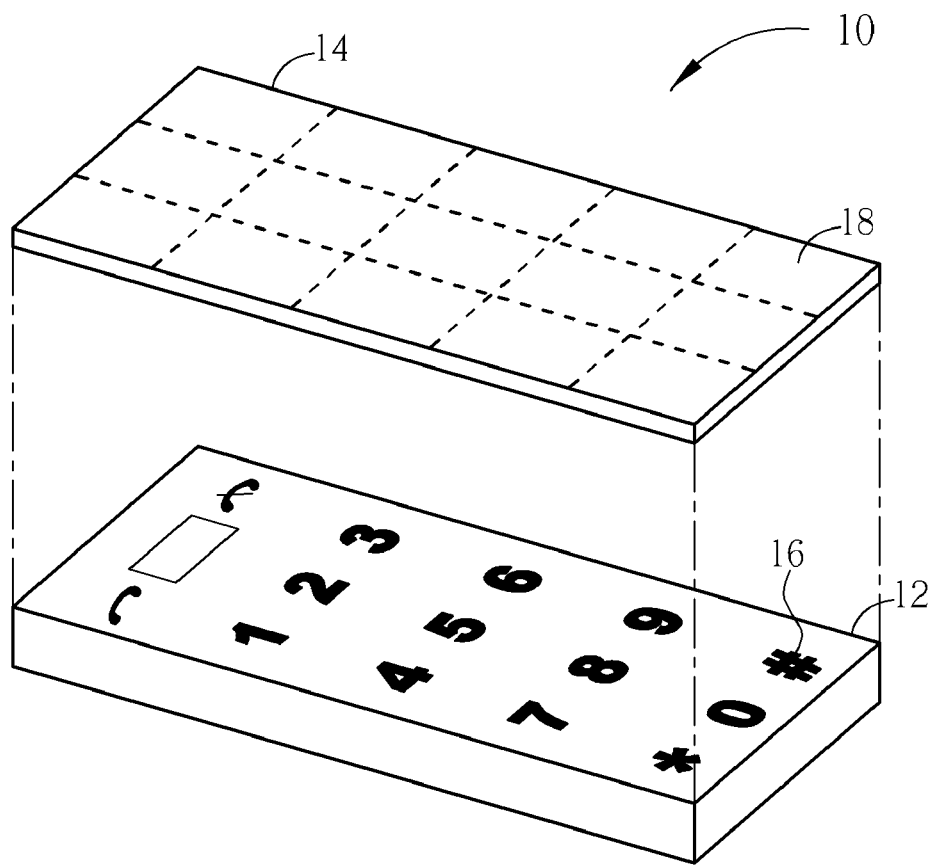
FIG. 1 is a schematic diagram illustrating a touch keypad according to the prior art.
Figure 2:
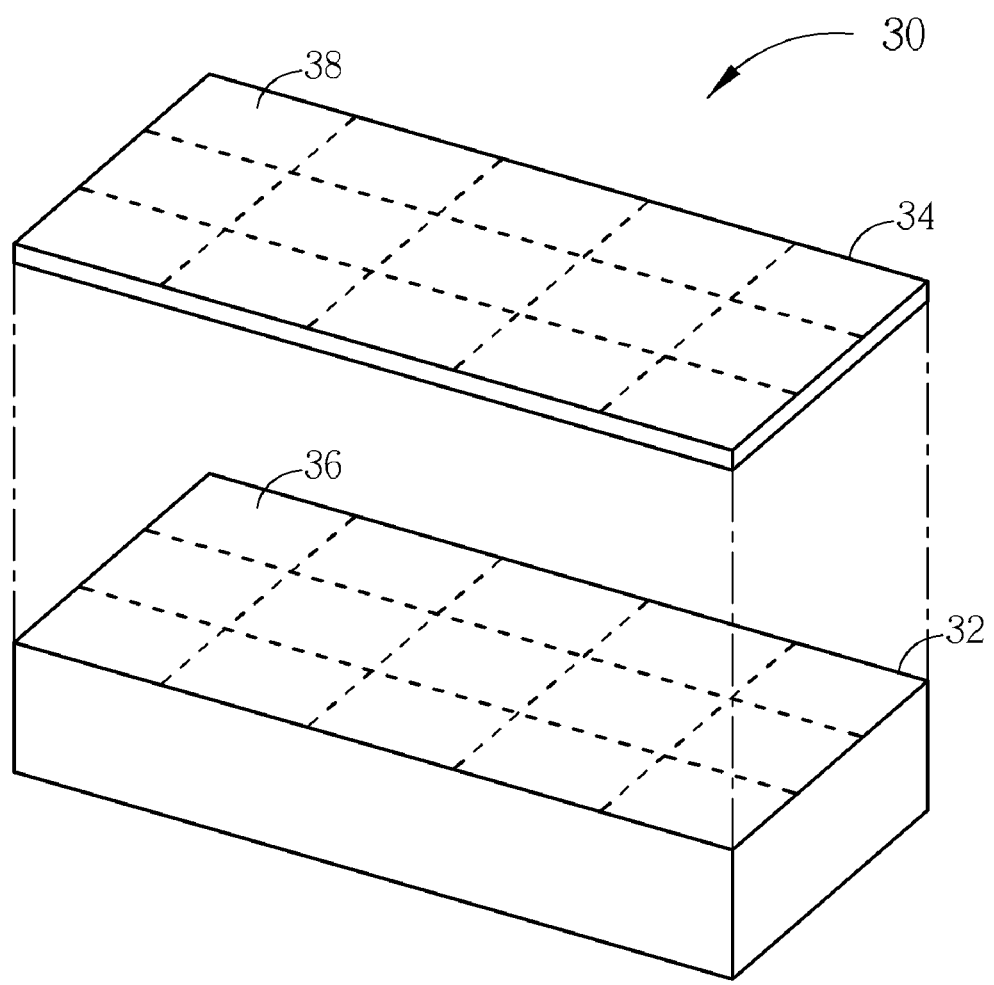
FIG. 2 is a schematic diagram illustrating a touch display panel according to the prior art.
Figure 3:
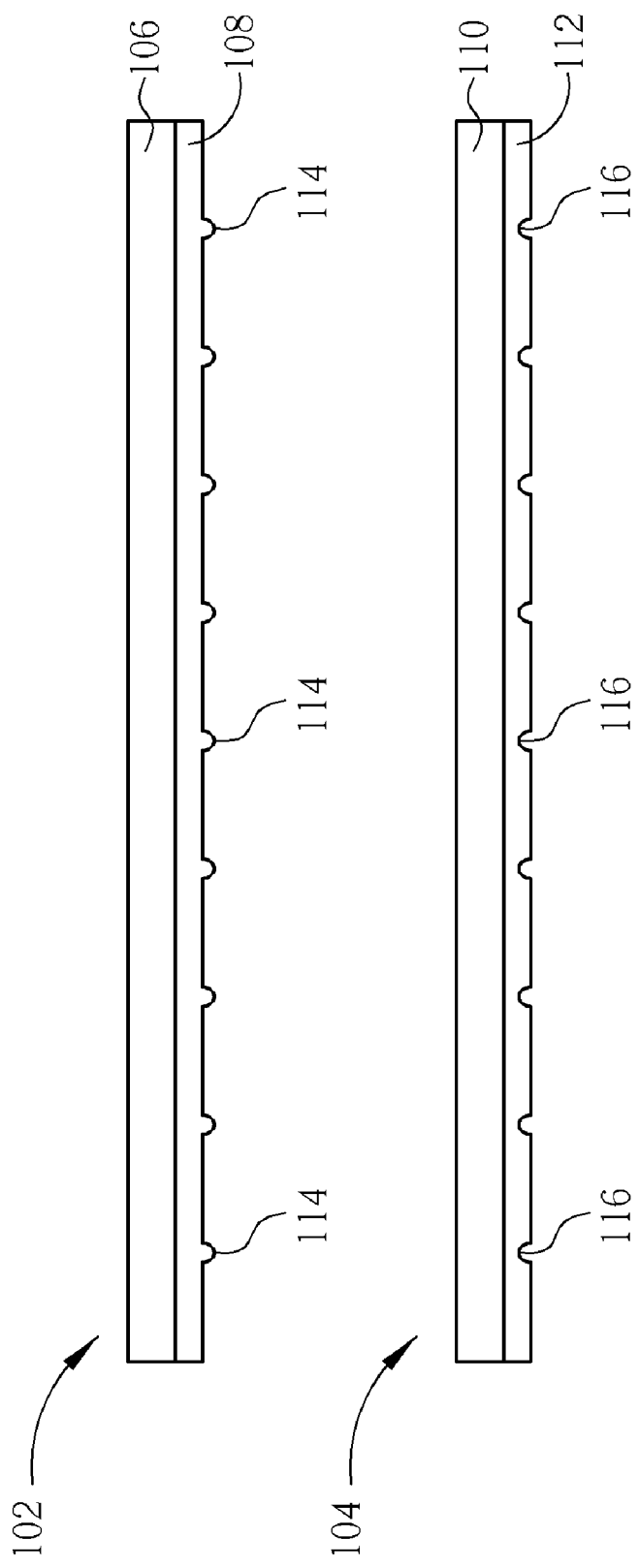
FIG. 3 through FIG. 6 are schematic diagrams illustrating a manufacturing method of a control panel according to a first embodiment of the present invention.
Figure 5:
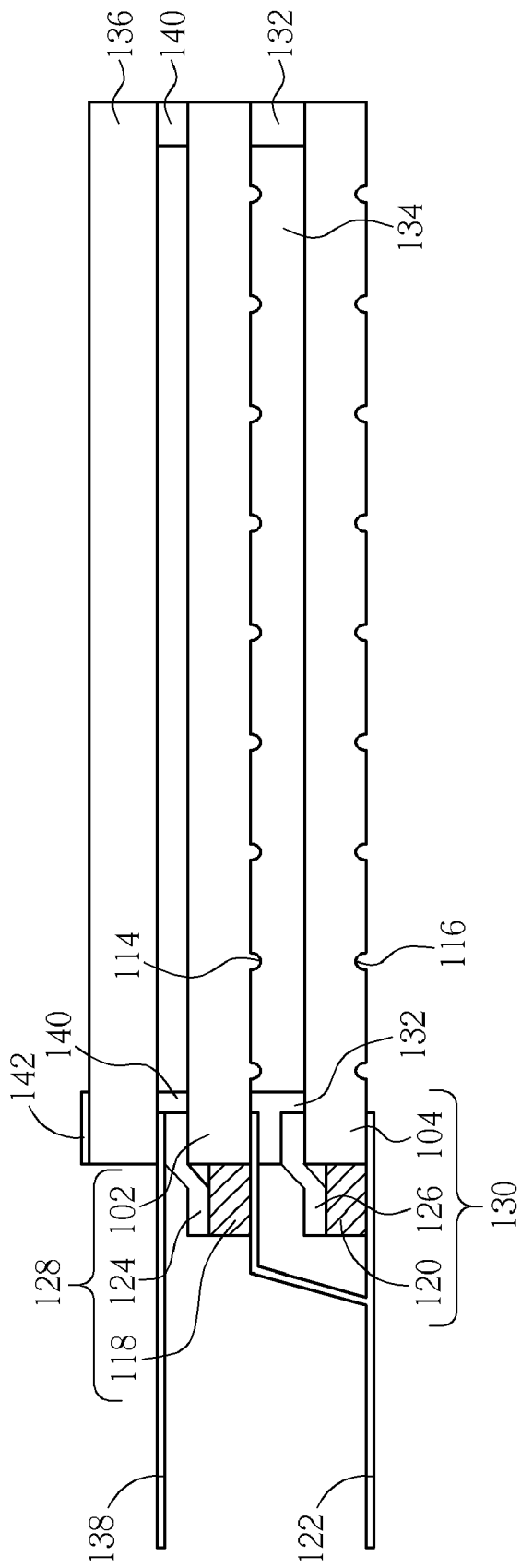
Figure 6:
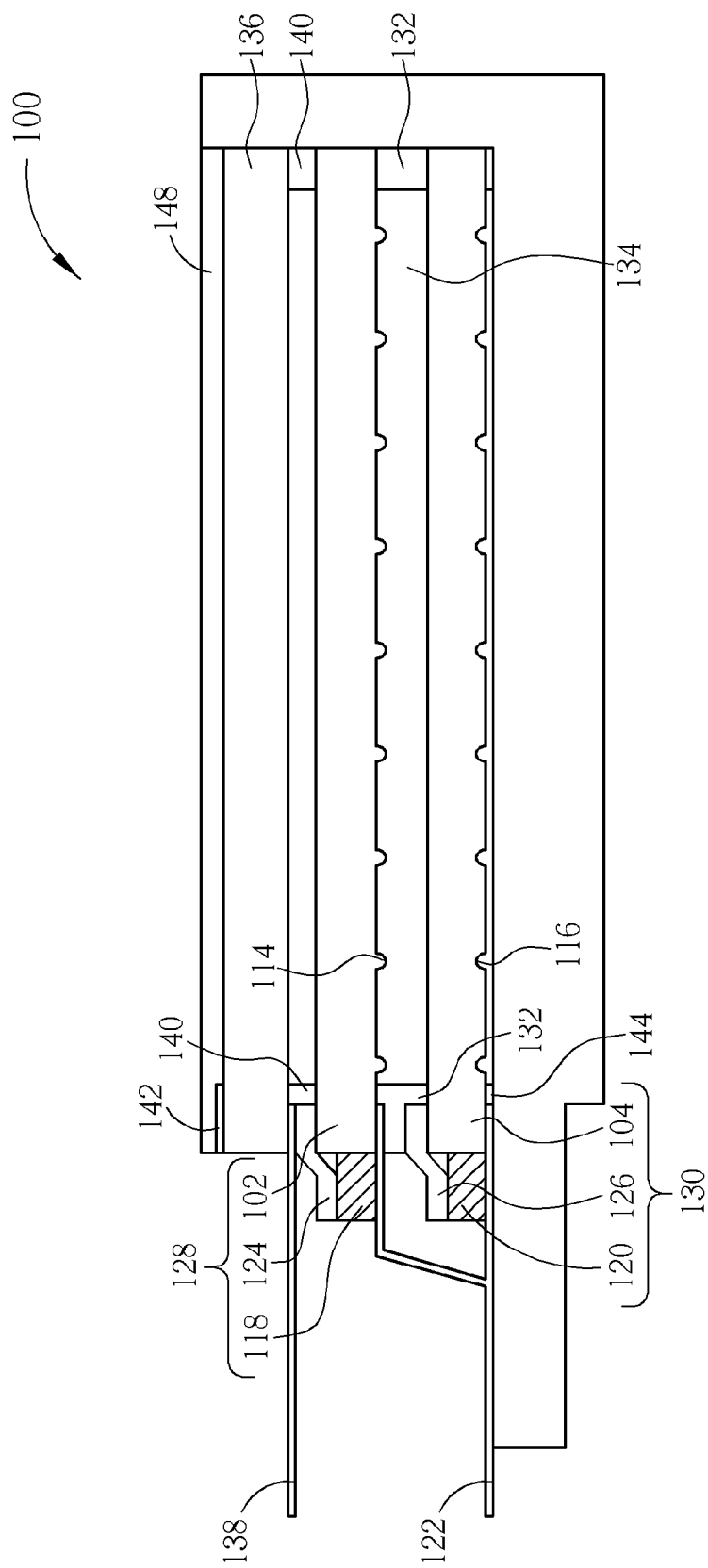
Figure 7:
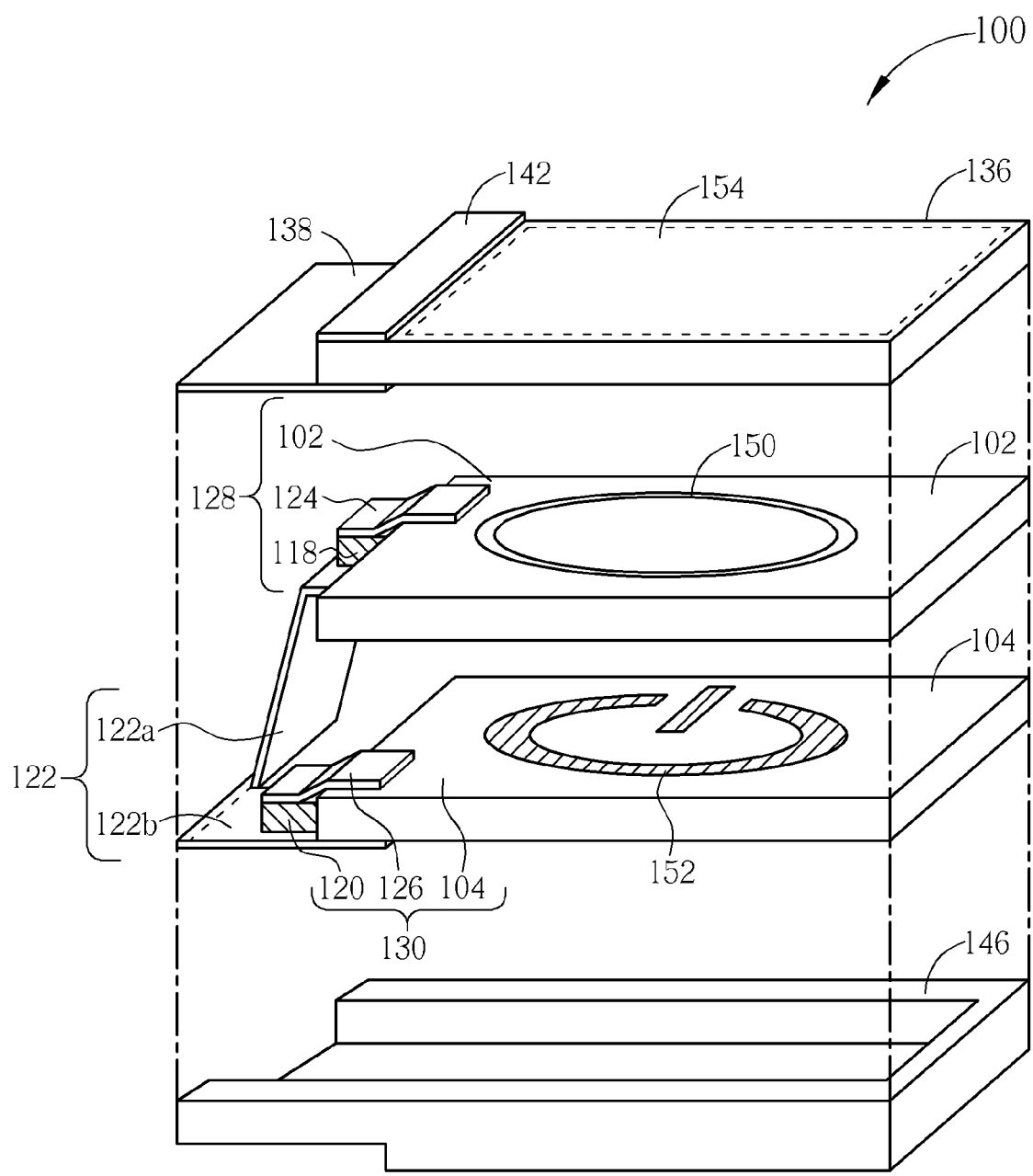
FIG. 7 is a stereoscopic exploded diagram illustrating the control panel according to the first embodiment of the present invention.

Please refer to FIG. 3 through FIG. 7. FIG. 3 through FIG. 6 are schematic diagrams illustrating a manufacturing method of a control panel according to a first embodiment of the present invention. FIG. 7 is a stereoscopic exploded diagram illustrating the control panel according to the first embodiment of the present invention. As shown in FIG. 3, first, a first light guide plate 102 and a second light guide plate 104 are provided. The first light guide plate 102 has at least one first pattern, and the second light guide plate 104 has at least one second pattern. The following description takes a step of forming the first light guide plate 102 as an example to describe steps of forming a light guide plate with a pattern. In the step of forming the first light guide plate 102, a mold is first provided, and the mold has holes with the first pattern. Then, an ultraviolet (UV) glue, such as ultraviolet curing resin, is dropped on the surface of the mold having the holes with the first pattern. Next, a first transparent light guide material 106, such as polycarbonate (PC), poly methyl-methacrylate (PMMA) or a composite material thereof, is pressed on the mold with the UV glue, so that the UV glue is uniformly disposed between the first transparent light guide material 106 and the mold. The holes with the first pattern are filled up with the UV glue to form the first pattern. Then, a UV glue curing process is performed to cure the UV glue, so that a first UV glue layer 108 is formed. The first UV glue layer 108 is bonded to the first transparent light guide material 106, and the first UV glue layer 108 has the first pattern. Finally, the first transparent light guide material 106 with the first UV glue layer 108 is released from the mold, so that the first light guide plate 102 with the first pattern is formed. In this embodiment, the step of forming the first light guide plate 102 and a step of forming the second light guide plate 104 are the same, and the step of forming the second light guide plate 104 is not detailed redundantly. The second light guide plate 104 includes a second transparent light guide material 110 and a second UV glue layer 112 with a second pattern. In addition, the first UV glue layer 108 of this embodiment has a plurality of bumps 114, so that the first pattern is constituted by the bumps 114. The second UV glue layer 112 has a plurality of holes 116, so that the second pattern is constituted by the holes 116. Or, the second UV glue layer also can have a plurality of bumps, so that the second pattern is constituted by the bumps. In this embodiment, the bumps 114 are preferable to be disposed under the first transparent light guide material 106, and the holes 116 are preferable to be disposed under the second transparent light guide material 110. Therefore, when the light is reflected by the bumps 114 or the holes 116, the light can directly emit to the outside to display the first pattern or the second pattern, so that the clearer pattern can be displayed. The present invention is not limited to this, and the bumps 114 or the holes 116 of the present invention also can be disposed under the transparent first light guide material 106 or disposed under the second transparent light guide material 110.

Furthermore, the step of forming the first light guide plate or the second light guide plate of the present invention is not limited to the above-mentioned method, and the present invention also can use a laser-etching process or a chemical-etching process in combination with a mask having a required pattern to etch the first transparent light guide material 106 or the second transparent light guide material 110, so that the first light guide plate 102 with the first pattern or the second light guide plate 104 with the second pattern can be formed. Or, a hot-stamping process also can be used to bond a polymer thin film to the first transparent light guide material 106 or the second transparent light guide material 110. Then, the first transparent light guide material 106 or the second transparent light guide material 110 with the polymer thin film is heated, and a mold having holes with the first pattern or the second pattern is pressed on the polymer thin film. Thereafter, the temperature is lowered, so that the polymer thin film is solidified. The polymer thin film has the first pattern or the second pattern. The material of the polymer thin film can include PMMA, polystyrene (PS) or phenolic resin.

Figure 4:
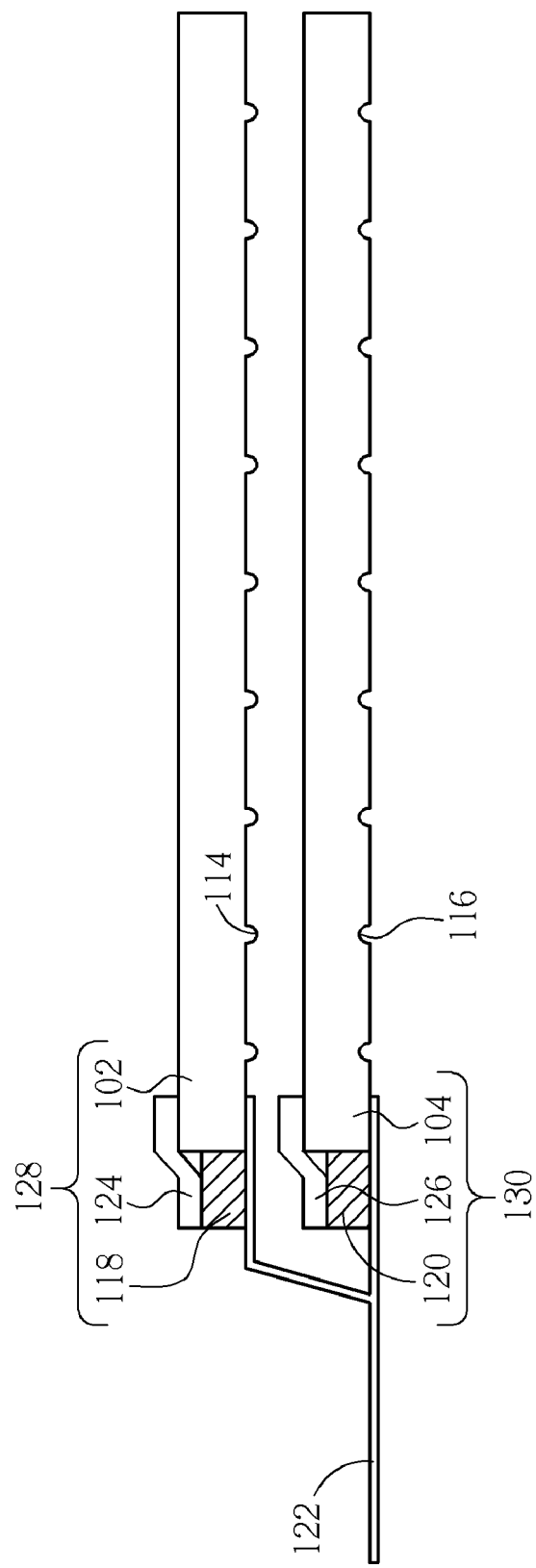

Next, as shown in FIG. 4, at least one first light source 118 and at least one second light source 120 are disposed on a first flexible printed circuit (FPC) 122, and the first FPC 122 is electrically connected to the first light source 118 and the second light source 120. Then, the first light guide plate 102 and the second light guide plate 104 are bonded to the first FPC 122. A light exit surface of the first light source 118 faces a sidewall of the first light guide plate 102, and the first light source 118 is close to the first light guide plate 102. A light exit surface of the second light source 120 faces a sidewall of the second light guide plate 104, and the second light source 120 is close to the second light guide plate 104. Then, a first light shielding layer 124 is disposed on the first light source 118 and a part of the first light guide plate 102, and a second light shielding layer 126 is disposed on the second light source 120 and a part of the second light guide plate 104. The light emitted from the first light source 118 and the second light source 120 can be shield to avoid the light emitted from the first light source 118 emit into the second light guide plate 104 and to avoid the light emitted from the second light source 120 emit into the first light guide plate 102. The first light source 118, the first light guide plate 102 and a first light shielding layer 124 constitute a first display plate 128, and the second light source 120, the second light guide plate 104 and the second light shielding layer 126 constitute a second display plate 130. In this embodiment, the first light source 118 and the second light source 120 are light emitting diodes, and the colors of the light generated from the first light source 118 and the second light source 120 are different. The present invention is not limited to this, and the first light source 118 and the second light source 120 of the present invention also can be light emitting diodes with a same color.

Then, as shown in FIG. 5, an adhesive, such as optical adhesive, is used to bond the first display plate 128 to the second display plate 130, so that a first adhesive layer 132 is formed between the first display plate 128 and the second display plate 130. A gap 134 exists between the first display plate 128 and the second display plate 130, and a height of the gap 134 is substantially 0.05 mm. The first adhesive layer 132 is close to the sidewalls of the first display plate 128 and the second display plate 130, and the first adhesive layer 132 does not cover the bumps 114 and the holes 116, so that the display of the first pattern and the second pattern will not be affected. In this embodiment, a medium in the gap 134 is air that is used to prevent the light emitted from the first light guide plate 102 from displaying the second pattern or to prevent the light emitted from the second light guide plate 104 from displaying the first pattern, and the medium of the present invention is not limited to be air. Next, a touch panel 136 is disposed on a second FPC 138 to be electrically connected to the second FPC 138. The touch panel 136 has at least one touch region.

Then, an adhesive, such as optical adhesive, is used to bond the touch panel 136 to the first display plate 128, so that a second adhesive layer 140 is formed between the touch panel 136 and the first display plate 128. In addition, an extending part of the second FPC 138 is disposed between the first display plate 128 and the touch panel 136. Furthermore, the step of disposing touch panel 136 on the second FPC 138 does not affect other steps of manufacturing the first display plate 128 and the second display plate 130, so that the step of combining the touch panel 136 and the first display plate 128 can be performed in other steps. For example, the step of combining the touch panel 136 and the first display plate 128 is performed before the step of disposing the first light source 118 and the second light source 120 on the first FPC 122. Thereafter, the manufacturing method of this embodiment can selectively form a cover layer 142 on the touch panel 138, so that the cover layer 142 can shield extending parts of the first FPC 122 disposed between the first display plate 128 and the second display plate 130 and disposed under the second display plate 130 and an extending part of the second FPC 138 disposed between the touch panel 136 and the first display plate 128. The first FPC 122 and the second FPC 138 can be prevented from being exposed, and an unsuitable appearance can be avoided.

Finally, as shown in FIG. 6, a third adhesive layer 144 is used to bond a combination of the first display plate 128, the second display plate 130 and the touch panel 136 to a holding base 146. The holding base 146 is constituted by a transparent insulating material, such as PC, acrylic, PMMA or a composite material thereof. Accordingly, a user can view the displayed pattern from the backside of the control panel. The holding base 146 surrounds a part of each of sidewalls of the first display plate 128, the second display plate 130 and the touch panel 136, and the first display plate 128, the second display plate 130 and the touch panel 136 can be protected. Next, the manufacturing method of this embodiment can selectively dispose a lens layer 148, such as PC, acrylic, PMMA or a composite material thereof, on the touch panel 136, so that the touch panel 136 can be protected, and the control panel 100 of this embodiment is finished.

As shown in FIG. 7, it should be noted that the first FPC 122 of this embodiment includes a first connecting part 122a and a second connecting part 122b. The first connecting part 122a is extended to be disposed between the first display plate 128 and the second display plate 130, and the second connecting part 122b is extended to be under the second display plate 130. In addition, the first light source 118 is disposed on the first connecting part 122a, and the second light source 120 is disposed on the second connecting part 122b. Furthermore, in the step of disposing the first light guide plate 102 and the second light guide plate 104, the first light guide plate 102 is bonded to the first connecting part 122a, and the second light guide plate 104 is bonded to the second connecting part 122b. For this reason, the first display plate 128 and the second display plate 130 can be electrically connected to a same flexible circuit board, and the size of the control panel 100 can be therefore reduced, so that the space for disposing the control panel 100 can be reduced. Furthermore, a vertical position of the first pattern 150 corresponds to a vertical position of the second pattern 152, and a vertical position of the touch region 154 of the touch panel 136 corresponds to the vertical position of the first pattern 150 and the vertical position of the second pattern 152. This means that the first pattern 150 and the second pattern 152 are disposed directly under the touch panel 154, and the second pattern 152 is disposed under the first pattern 150. In addition, the first pattern 150 of this embodiment is a hollow typeface, and the second pattern 152 of this embodiment is a solid typeface. The present invention is not limited to this, and the first pattern and the second pattern of the present invention can be respectively a hollow typeface or a solid typeface.

Figure 8:
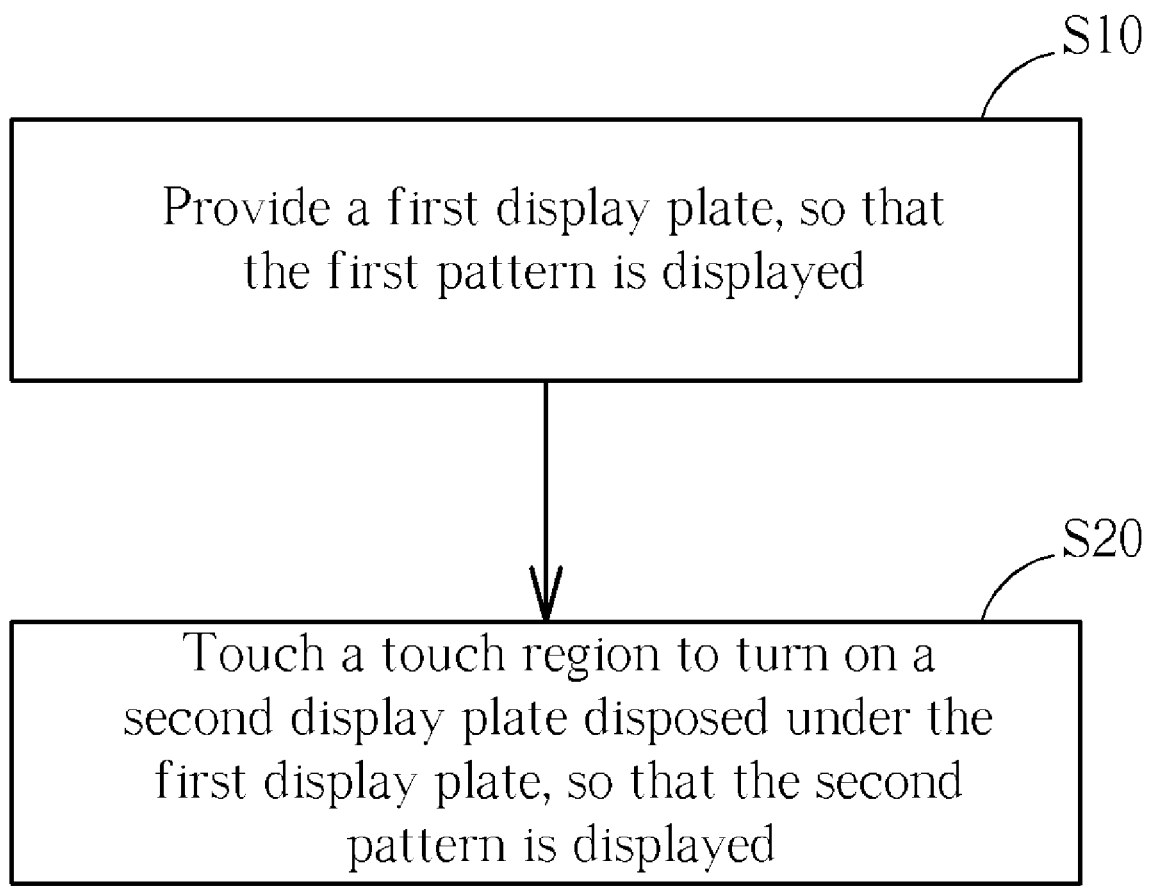
FIG. 8 is a flow chart of the control method of the control panel according to the first embodiment of the present invention.

According to the control panel of the above-mentioned embodiment, the present invention further provides a control method of the control panel. Please refer to FIG. 8, which is a flow chart of the control method of the control panel according to the first embodiment of the present invention. As shown in FIG. 8, the control method of the control panel in this embodiment includes:

Step S10: provide a first display plate having a first pattern, and the first display plate is in an on-state, so that the first pattern is displayed; and Step S20: touch a touch region of a touch panel disposed on the first display plate to turn on a second display plate disposed under the first display plate and having a second pattern, so that the second pattern is displayed.

Figure 9:
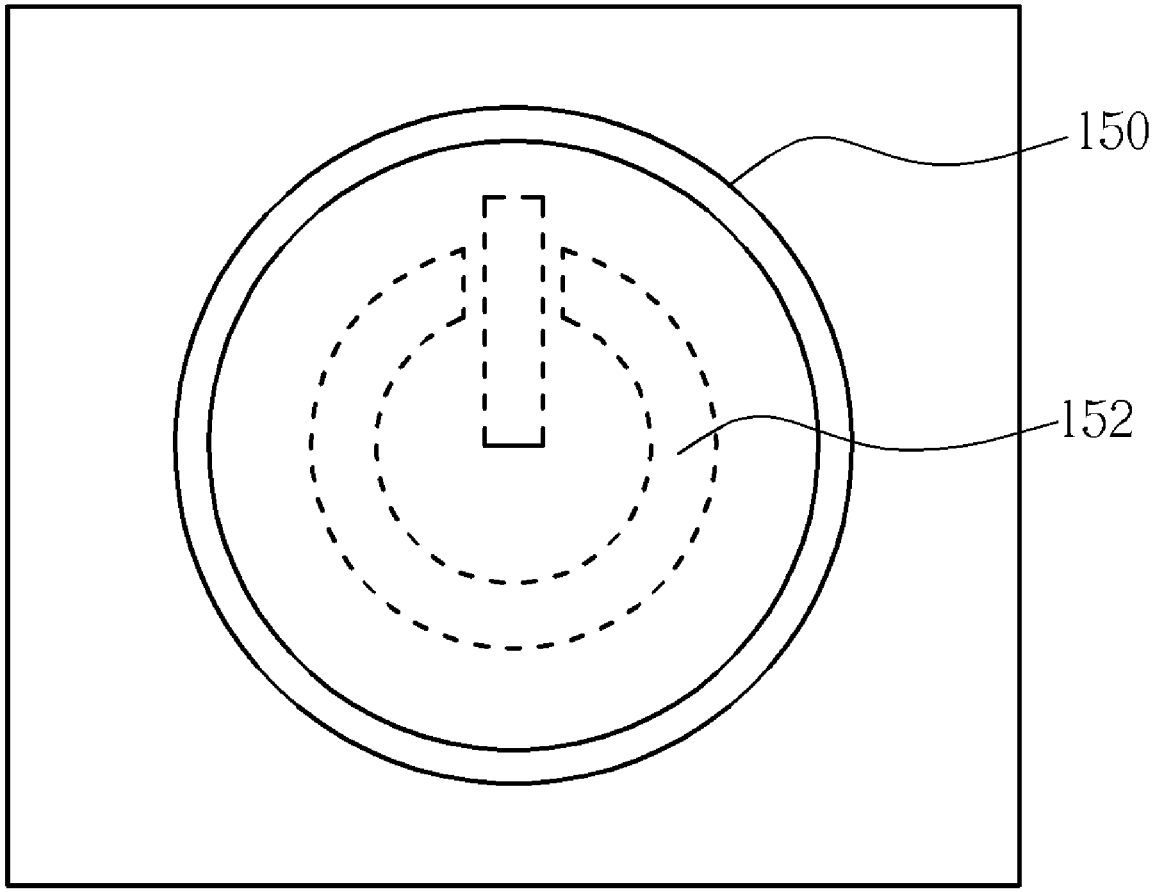
FIG. 9 and FIG. 10 are schematic diagrams illustrating the patterns displayed by the control panel indifferent steps according to the first embodiment of the present invention.
Figure 10:
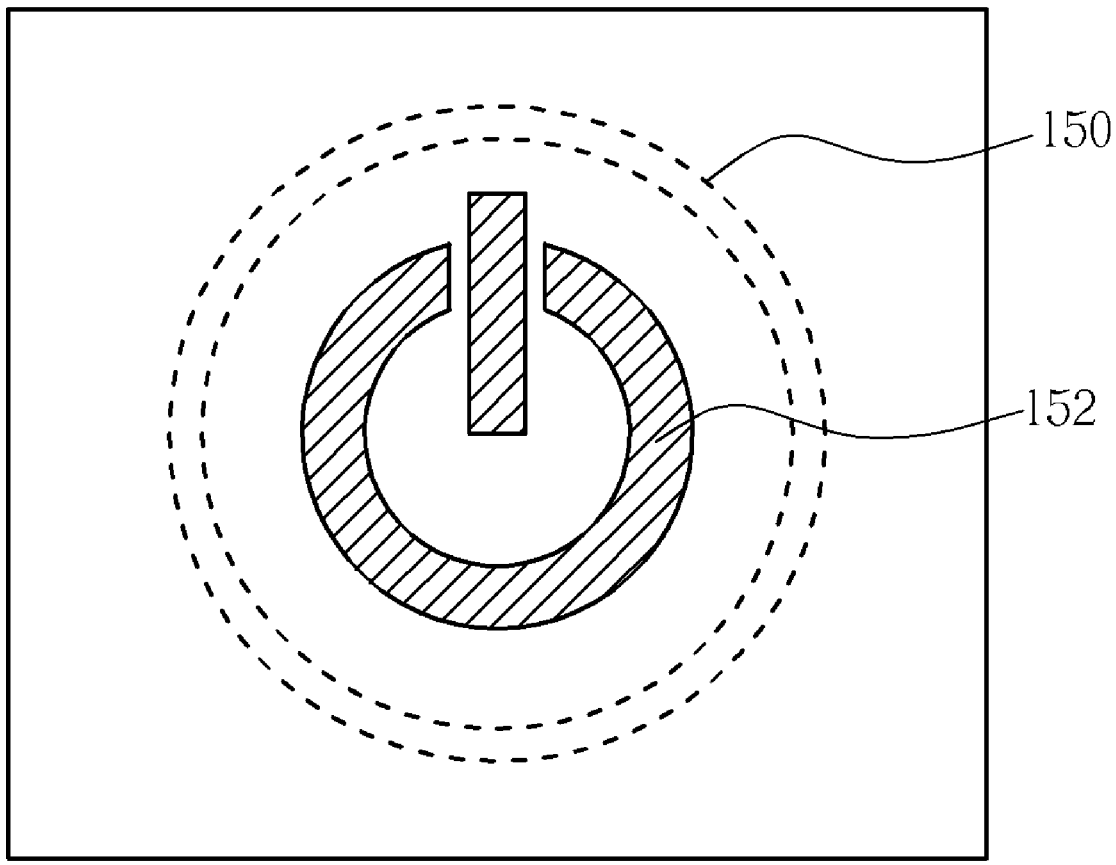

In order to particularly describe the control method of the control panel, please refer FIG. 9 and FIG. 10, and refer to FIG. 7 and FIG. 8 again. FIG. 9 and FIG. 10 are schematic diagrams illustrating the patterns displayed by the control panel in different steps according to the first embodiment of the present invention. As shown in FIG. 7 through FIG. 9, in step S10, the control panel 100 is electrically connected to a power source that has been turned on, so that the control panel is in an on-state. This means the first light source 118 of the first display plate 128 is turned on. The light of the first light source 118 emits into the first light guide plate 102, so that the first pattern 150 is displayed. In addition, because the gap 134 constituted by air exists between the first light guide plate 102 and the second light guide plate 104, more light emitting into the first light guide plate 102 will be reflected during the light strikes the interface between the first light guide plate 102 and the gap 134. The light is reflected by the bumps 114, so that the light has the first pattern 150. The first pattern 150 can therefore be displayed upwardly.

As shown in FIG. 7, FIG. 8 and FIG. 10, in step S20, when a body, such as finger, touches the touch region 154 of the touch panel 136, the touch panel 136 will transfer a signal of the touch region 154 corresponding to the first pattern 150 and the second pattern 152 being touched to a control unit, and then, the signal is transformed into a control signal and a turning-on signal. The control signal is transferred to a device to generate an action. For example, the control signal is transferred to a display device, so that an image is displayed by the display device. The turning-on signal is transferred to the control panel 100, so that the second light source 10 of the second display plate 130 is turned on. The second pattern 152 disposed under the first pattern 150 is therefore displayed. In addition, step S20 in this embodiment further includes turning off the first display plate 128 before turning on the second light source 120, so that the second pattern 152 is only displayed. Accordingly, the pattern displayed by the control panel 100 of this embodiment can be transformed from the first pattern 150 to the second pattern 152 by the touching motion. Furthermore, in the structure of the control panel 100, the first pattern 150 and the second pattern 152 is disposed directly under the touch region 154, and the second pattern 152 disposed under the first pattern 150. For this reason, the control panel 100 can display changes of different patterns in different layers, and an effect of changing patterns in the same touch region can be provided. Next, as shown in FIG. 9, the control method of this embodiment further includes touching the touch panel 136 again after the step S20. The second display plate 130 can be therefore turned off, and the first display plate 128 is turned on. Accordingly, the control panel 100 returns to the on-state, and the first pattern 150 is only displayed. It should be noted that the step S20 of the present invention is not limited to include turning off the first display plate 128, and the first pattern 150 and the second pattern 152 can be displayed simultaneously in step S20.

Figure 11:
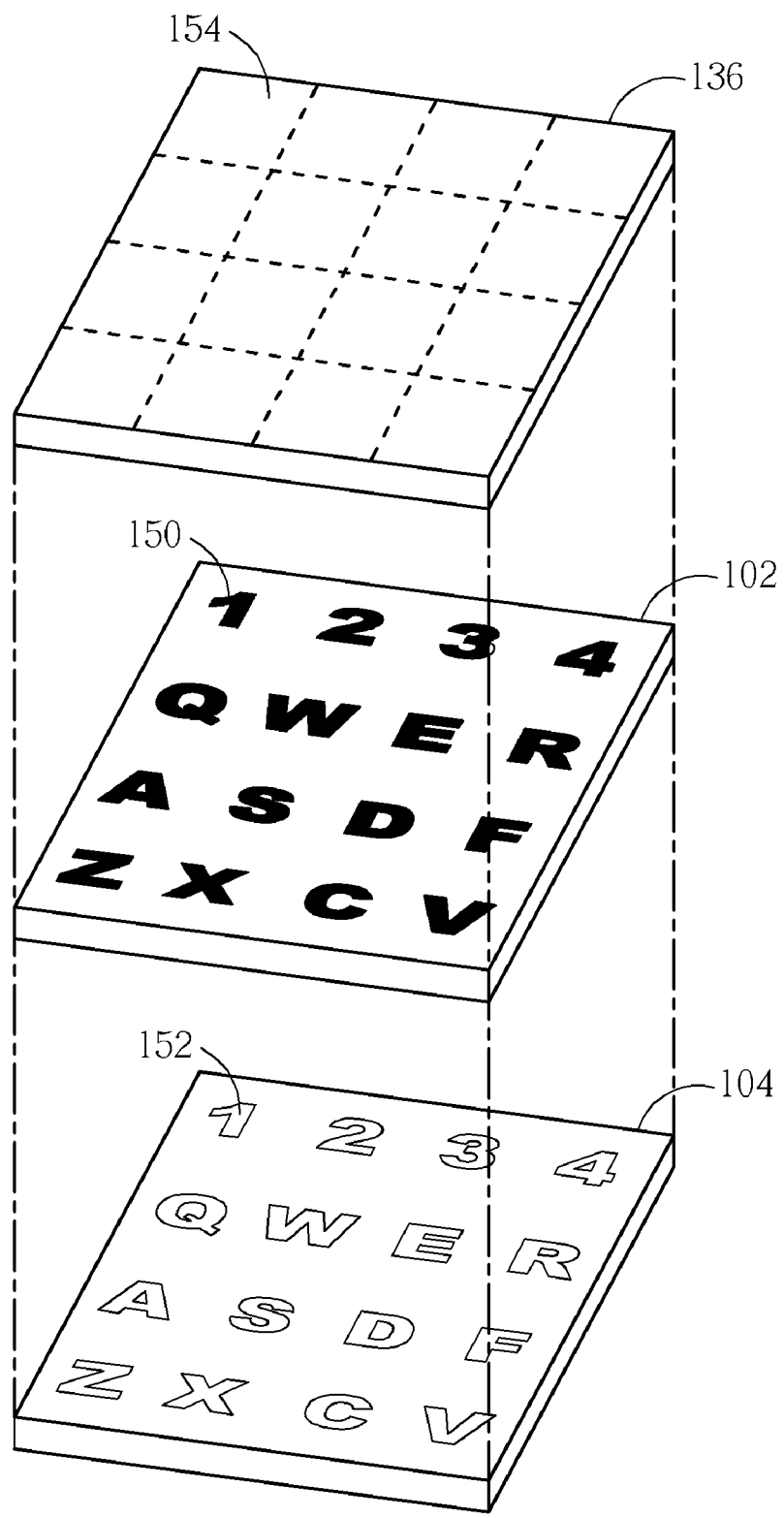
FIG. 11 is a schematic diagram illustrating another example of the touch panel, the first light guide plate and the second light guide plate of the control panel according to the first embodiment of the present invention.

In addition, the first pattern and the second pattern are not limited to respectively represent only a pattern, and the touch panel also can have a plurality of touch regions. Please refer FIG. 11, which is a schematic diagram illustrating another example of the touch panel, the first light guide plate and the second light guide plate of the control panel according to the first embodiment of the present invention. As shown in FIG. 11, in this example, the touch panel 136 further has a plurality of touch regions 154. In addition, the first light guide plate 102 further has a plurality of first patterns 150, and each first pattern 150 is a solid typeface. The second light guide plate 104 further has a plurality of second patterns 152, and each second pattern 152 is a hollow typeface. Each first pattern 150 and each second pattern 152 are disposed directly under each touch region 154.

Figure 12:
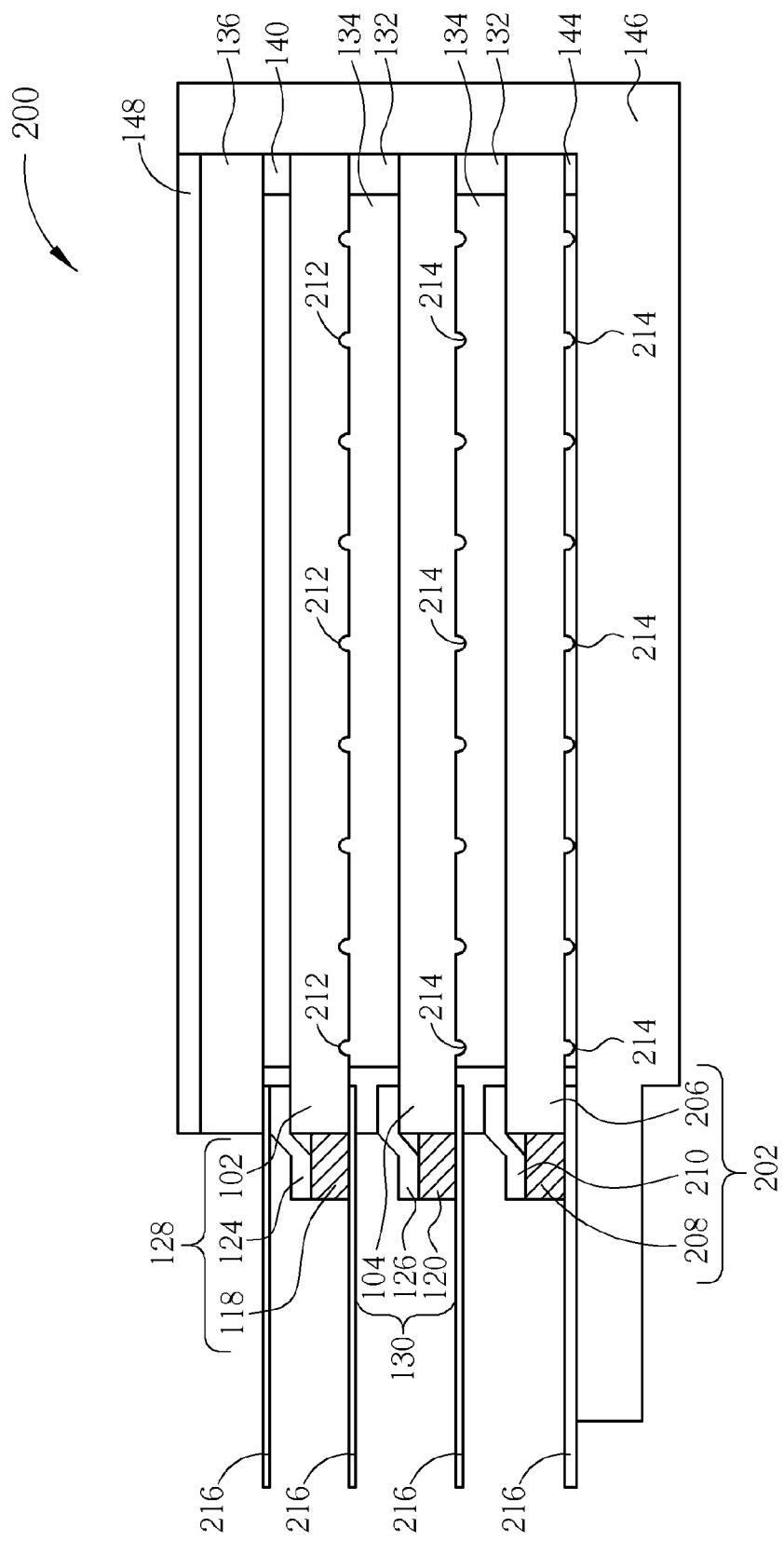
FIG. 12 is a schematic diagram illustrating a cross section of a control panel according to a second embodiment of the present invention.
Figure 13:
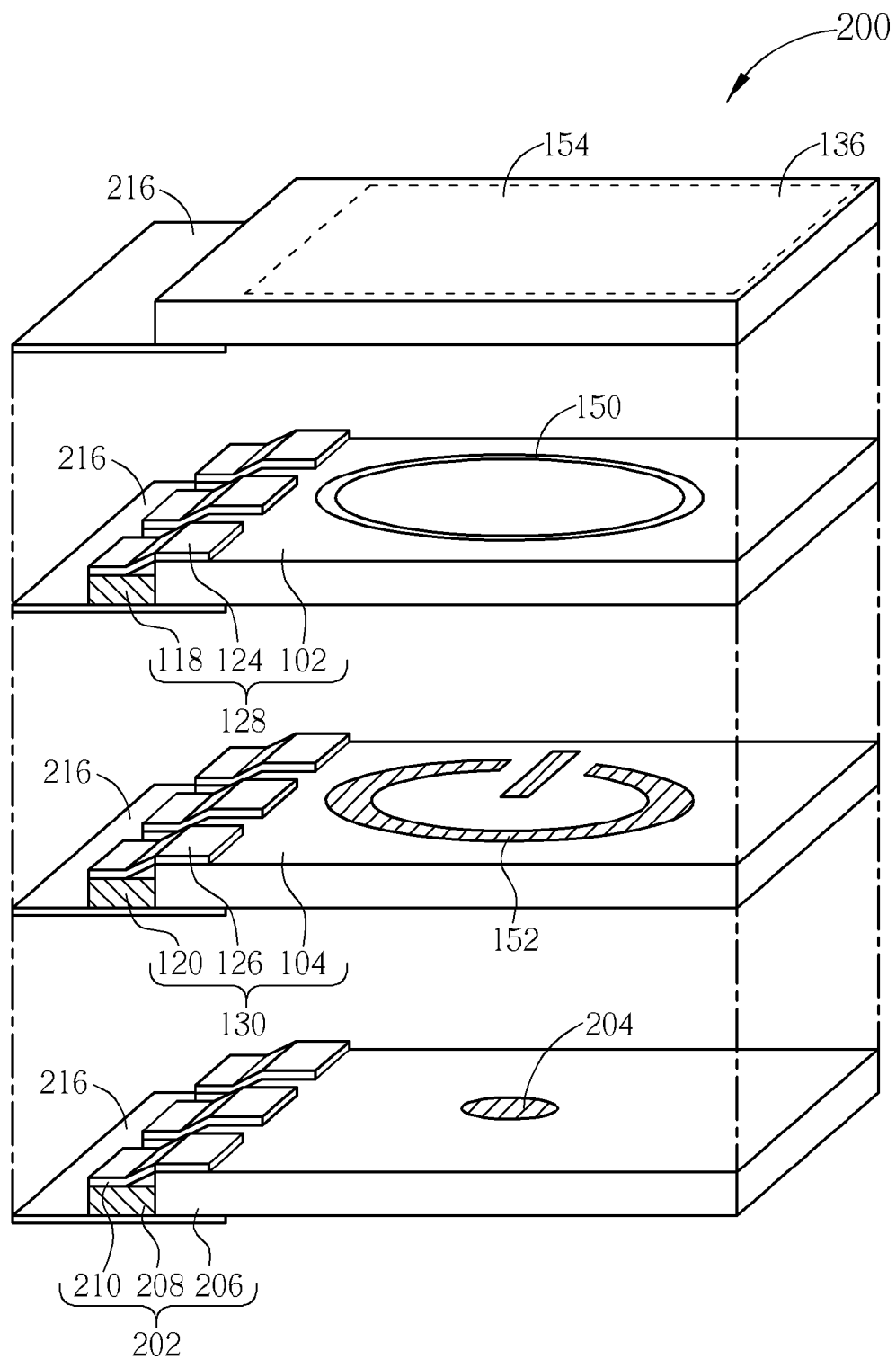
FIG. 13 is a stereoscopic exploded diagram illustrating the control panel according to the second embodiment of the present invention.

Furthermore, the control panel of the present invention is not limited to have only two display plates, and the control panel of the present invention also can include a plurality of display plates. Each display plate is not limited to include only one light source. In order to describe differences between the following embodiment and the first embodiment, devices in the following embodiment uses same symbols as the devices in the first embodiment, and structures in the following embodiment the same as the first embodiment will not detailed redundantly. Please refer to FIG. 12 and FIG. 13. FIG. 12 is a schematic diagram illustrating a cross section of a control panel according to a second embodiment of the present invention. FIG. 13 is a stereoscopic exploded diagram illustrating the control panel according to the second embodiment of the present invention. As shown in FIG. 12 and FIG. 13, as compared with the first embodiment, the control panel 200 of this embodiment further includes a third display plate 202 disposed between the second display plate 130 and the holding base 146. The first display plate 128 of this embodiment further includes a plurality of first light sources 118, and the second display plate 130 further includes a plurality of second light sources 120. The third display plate 202 is constituted by a third light guide plate 206 having a third pattern 204, a plurality of third light sources 208 disposed at an edge of the third light guide plate 206 and a third light shielding layer 210 covering the third light sources 208 and a part of the third light guide plate 202. The first light guide plate 102, the second light guide plate 104 and the third light guide plate 206 of this embodiment can generate uniform light due to disposing several light sources. In addition, the third pattern 204 is disposed directly under the touch region 154, and a vertical position of the third pattern 204 corresponds to the vertical positions of the first pattern 150 and the second pattern 152. In this embodiment, the first pattern 150 is constituted by a plurality of holes 212, and the second pattern 152 and the third pattern 204 are respectively constituted by a plurality of bumps 214. Furthermore, the third pattern 204 of this embodiment is a solid typeface. In addition, the control panel 200 of this embodiment includes a plurality of FPCs 216, and the first display plate 128, the second display plate 130 and the third display plate 202 are respectively disposed on each FPC 216 to be electrically connected to each FPC 216. The control panel 200 of this embodiment does not include the cover layer 142.

Figure 14:
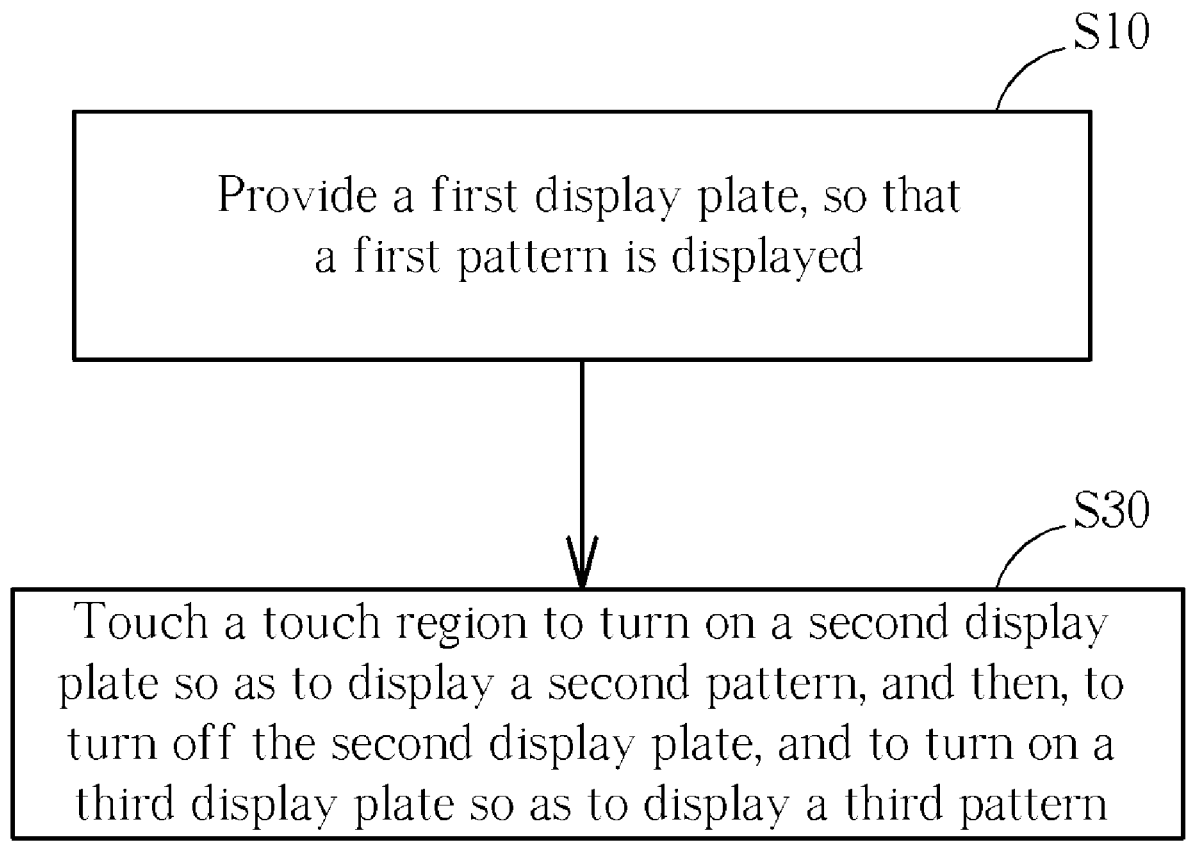
FIG. 14 is a flowchart of a control method of the control panel according to the second embodiment of the present invention.
Figure 15:
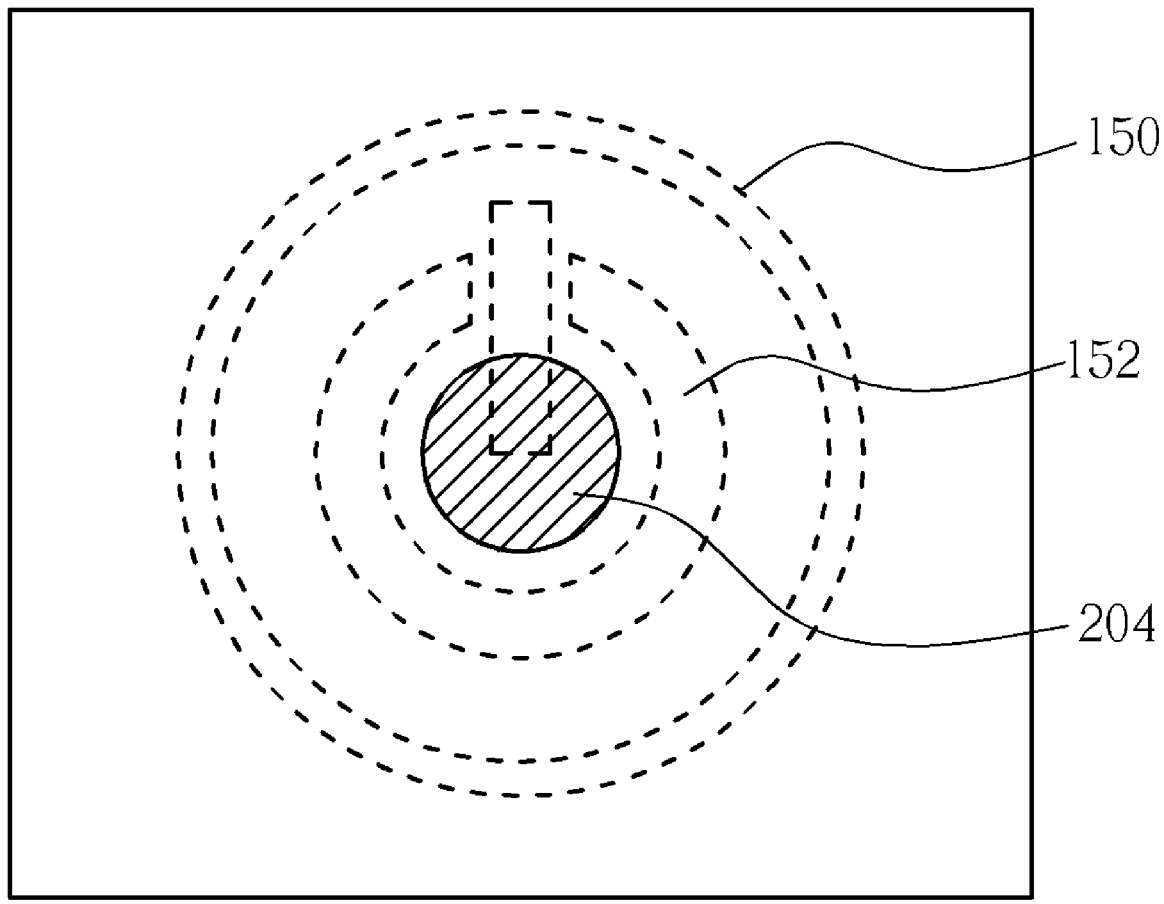
FIG. 15 is a schematic diagram illustrating the pattern displayed by the control panel according to the second embodiment of the present invention.

Please refer to FIG. 14 and FIG. 15, and refer to FIG. 10 and FIG. 13. FIG. 14 is a flow chart of a control method of the control panel according to the second embodiment of the present invention. FIG. 15 is a schematic diagram illustrating the pattern displayed by the control panel according to the second embodiment of the present invention. As shown in FIG. 13 and FIG. 14, as compared with the first embodiment, the control method of this embodiment also performs step S10 first, and then, performs step S30. Step S30 includes touching the touch region 154 to turn on the second display plate 130 so as to display the second pattern 152, and then, turning off the second display plate 130 and turning on the third display plate 202 so as to display the third pattern 204. This means that step S30 further includes turning on the third display plate 202 to only display the third pattern 204 after the step of turning on the second display plate 128 and turning off second display plate 128 between the step of turning on the second display plate 128 and the step of turning on the third display plate 202 as compared with step S20 of the first embodiment. As shown in FIG. 10, in step S30 of this embodiment, when the second display plate 130 is turned on, the touch panel 136 received a signal of the second display plate 130 being turning on, so that the control unit electrically connected to the control panel 200 transforms the signal into a turn-off signal and a turn-on signal. Next, as shown in FIG. 15, after a period, the turn-off signal and the turn-on signal are transferred to the control panel 200 sequentially in turn. Therefore, the second light source 120 of the second display plate 130 is turned off, and then, the third light source 208 of the third display plate 202 is turned on, so that the third pattern 204 is only displayed. It should be noted that step S30 of this embodiment is not limited to include turning off the second display plate 130, and the present invention also can display the second pattern 152 and the third pattern 204 together in step S30. When a combination of the second pattern 152 and the third pattern 204 is designed as a stereoscopic pattern, the stereoscopic pattern can be displayed by displaying the second pattern 152 and the third pattern 204 together.

In summary, the control panel of the present invention provides a plurality of display plates, and the pattern of each display plate corresponds to a same touch region. The control panel can therefore display changes of different patterns in different layers, and an effect of changing patterns in the same touch region can be therefore provided.

Those skilled in the art will readily observe that numerous modifications and alterations of the device and method may be made while retaining the teachings of the invention.

What is claimed is:

1. A control method of a control panel, comprising:
providing a first display plate having at least one first pattern, and the first display plate being in an on-state and displaying the first pattern; and
touching a touch region of a touch panel disposed on the first display plate to turn on a second display plate disposed under the first display plate and having at least one second pattern, so that the second pattern is displayed.

2. The control method of claim 1, wherein the first pattern and the second pattern are disposed directly under the touch region.

3. The control method of claim 1, wherein after the step of touching the touch region, the control method further comprises turning off the first display plate to only display the second pattern.

4. The control method of claim 3, wherein after the step of touching the touch region, the control method further comprises touching the touch panel again to turn off the second display plate and to turn on the first display plate, so that the first pattern is only displayed.

5. The control method of claim 1, wherein the first display plate comprises a first light guide plate having the first pattern and at least one first light source disposed at an edge of the first light guide plate, and the on-state is turning on the first light source.

6. The control method of claim 5, wherein the second display plate comprises a second light guide plate having the second pattern and at least one second light source disposed at an edge of the second light guide plate, and the step of turning on the second display plate is to turn on second light source.

7. The control method of claim 1, wherein after the step of turning on the second display plate, the control method further comprises turning on a third display plate disposed under the second display plate and having at least one third pattern to display the third pattern.

8. The control method of claim 7, wherein between the step of turning on the second display plate and the step of turning on the third display plate, the control method further comprises turning off the second display plate to only display the third pattern.

9. The control method of claim 7, wherein the third display plate comprises a third light guide plate having the third pattern and at least one third light source disposed at an edge of the third light guide plate, and the step of turning on the third display plate is to turn on the third light source.

10. A control panel, comprising:
a first display plate, the first display plate comprising a first light guide plate and at least one first light source, wherein the first light source is disposed at an edge of the first light guide plate, and the first light guide plate has at least one first pattern;
a second display plate, disposed under the first display plate, and the second display plate comprising a second light guide plate and at least one second light source, wherein the second light source disposed at an edge of the second light guide plate, and the second light guide plate has at least one second pattern;
an adhesive layer, disposed between the first display plate and the second display plate, so that a gap exists between the first display plate and the second display plate;
a touch panel, disposed on the first display plate, the touch panel having at least one touch region, and the first pattern and the second pattern being disposed under the touch region;
a first flexible printed circuit, electrically connected to the first light source and the second light source; and
a second flexible printed circuit, electrically connected to the touch panel.

11. The control panel of claim 10, wherein the first pattern is a hollow typeface.

12. The control panel of claim 10, wherein the second pattern is a solid typeface.

13. The control panel of claim 10, wherein the first light guide plate has a plurality of bumps, and the bumps constitute the first pattern.

14. The control panel of claim 10, wherein the second light guide plate has a plurality of holes, and the holes constitute the second pattern.

15. The control panel of claim 10, wherein the first flexible printed circuit comprises a first connecting part and a second connecting part, the first light source is disposed on the first connecting part, and the second light source is disposed on the second connecting part.

16. The control panel of claim 10, wherein the gap is substantially 0.05 mm.

17. The control panel of claim 10, further comprising a first light shielding layer and a second light shielding layer, wherein the first light shielding layer is disposed on first light source, and the second light shielding layer is disposed between the first light source and the second light source.

18. The control panel of claim 10, further comprising a cover layer, disposed on the touch panel to hide extending parts of the first flexible printed circuit disposed between the first light guide plate and the second light guide plate and disposed under the second light guide plate and to hide an extending part of the second flexible printed circuit disposed between the touch panel and the first light guide plate.

19. The control panel of claim 10, further comprising a holding base, disposed under the second display plate and surrounding a part of each of sidewalls of the first display plate, the second display plate and the touch panel.

20. The control panel of claim 10, further comprising a lens layer, disposed on the touch panel to protect the touch panel.

* * * * *